United States Patent [19]

Yamane et al.

[11] Patent Number: 4,935,848

[45] Date of Patent: Jun. 19, 1990

[54] FUSED SOLID ELECTROLYTIC CAPACITOR

[75] Inventors: Masayuki Yamane; Masashi Iida, both of Tokyo, Japan

[73] Assignee: NEC Corporation, Japan

[21] Appl. No.: 238,554

[22] Filed: Aug. 30, 1988

[30] Foreign Application Priority Data

Aug. 31, 1987 [JP] Japan ................................ 62-218209

[51] Int. Cl.[5] ................................................ H01G 9/00

[52] U.S. Cl. ..................................................... 361/534

[58] Field of Search ............... 361/433, 321, 306, 272, 361/275, 328, 330, 534

[56] References Cited

U.S. PATENT DOCUMENTS 3,971,970 7/1976 Voyles et al. ................... 361/433 C 4,107,762 8/1978 Shirn et al. ..................... 361/433 C 4,288,842 9/1981 Voyles ........................... 361/433 C 4,591,951 5/1986 Iwamoto et al. ................ 361/433 S

*Primary Examiner*—Donald A. Griffin

*Attorney, Agent, or Firm*—Laff, Whitesel, Conte & Saret

[57] ABSTRACT

A fused solid electrolytic capacitor comprises a six sided body having a pair of spaced parallel sides, one of which will be positioned next to any mounting structure which supports the capacitor. One end of a fuse wire may be connected to either of the spaced parallel sides. The other end of the fuse wire extends through an open passageway in an insulating block to a cathode electrode, thereby giving the fuse wire a fixed length. This way there is no danger that the fuse wire may short circuit along its length to either the capacitor body or the cathode electrode. A result is a smaller capacitor which may be manufactured with a greater harvest yield, as compared to the size and yield of similar prior art fused solid electrolytic capacitors.

7 Claims, 1 Drawing Sheet

12 1 41 10 31 11 51 21 23 45 43

FUSED SOLID ELECTROLYTIC CAPACITOR

BACKGROUND OF THE INVENTION

This invention relates to a fused solid electrolytic capacitor, and more particulary to a fusing arrangement of a chip type solid electrolytic capacitor.

Chip type solid electrolytic capacitors are used widely in various electronic circuits. It has a fault rate which is small. The fault thereof, if it occurs, is often in a mode of a short circuit. When the short circuit happens, a large short-circuit current flows to heat the capacitor element and sometimes to burn the capacitor element. For protecting other circuit components from this excessive short-circuit current, a fuse is incorporated into a solid electrolytic capacitor. As for prior art, there is such a solid electrolytic capacitor with a fuse incorporated therein as disclosed in U.S. Pat. No. 4,107,762 issued on Aug. 15, 1978.

The fusing arrangement in this prior art has a fundamental structure wherein one end of an external cathode lead is fixed by an adhesive insulating resin to a cathode layer on a side surface of a capacitor element. The resin adhesive insulates the cathode lead from the cathode layer of the capacitor element. One end of a fuse wire is connected to one end of a cathode lead, and the other end of the fuse wire is connected to the cathode layer on the side surface of the capacitor element. In such a fusing arrangement, there is the possibility that, in a process for fixing the external cathode lead against this adhesive resin layer and hardening the adhesive resin, a part of the cathode lead may pierce through the adhesive resin layer to make contact with the cathode layer.

To avoid such a possibility of a short-circuit, the thickness of the adhesive resin layer should be made large enough, e.g., 1 mm or more. However, components used in a chip type solid electrolytic capacitor must be very small in size in order to provide for miniaturization. For instance, the thickness of external leads is about 0.5 mm and the diameter of a fuse element is about 50 μm to 100 μm. Therefore, the adhesive resin layer having a thickness of 1 mm or more is an obstacle to prevent further reduction of the total size of the fused solid electrolytic capacitor.

Another shortcoming of fusing arrangements in the cited prior art is that the effective length of the fuse element is not constant, because the intermediate portion of the fuse wire may tend to make contact with the cathode layer on the side surface and its contacting portion varies. Furthermore, owing to the above reason, it is difficult to make the effective length of the fuse element long enough.

SUMMARY OF THE INVENTION

An object of the present invention is to provide a fusing arrangement which is capable of eliminating the possibility of a short circuit between a cathode external lead and a cathode layer of a capacitor element.

Another object of the present invention is to provide a thin chip type solid electorlytic capacitor incorporating a fusing arrangement adapted of high mass-producting and being easy to assemble.

Still other object of the present invention is to provide a fusing arrangement which is capable of uniformly setting a large effective length of a fuse element.

The present invention is featured in that one end of a cathode external lead, which is to be connected to one end of a fuse element, is located at a position spaced apart from the cathode layer of a capacitor element. The other end of the fuse is connected to the cathode layer covering the capacitor element on its bottom and its side surface between the bottom portion and the top portion. An anode external lead is led out from the top portion of the capacitor element.

According to another feature of the present invention, a fused solid electrolytic capacitor comprises a solid electorlytic capacitor element having a top surface provided with an anode terminal, a bottom surface opposing to the top surface, a side surface extending between the top surface and the bottom surface. A cathode layer is formed on the side surface and the bottom surface. An anode external lead has one end connected to the anode terminal, the other end of the anode external lead being bent into the shape of a letter "U", with arms extending toward the bottom surface. A cathode external lead has one end disposed in a position which is spaced from and opposed to substantially the center of the bottom surface of the capacitor element. The other end of the cathode external lead is bent into the shape of the letter "U", with arms extending toward the top surface. An insulating layer is formed on portions of the side surface and the bottom surface. A fuse element has one end connected to the one end of the U-shaped cathode external lead, the other end the fuse element being connected to the cathode layer provided on the side surface. An elastic resin coats the circumferential surface of the fuse element. An insulating material encapsulates the capacitor element and the elastic resin-coated fuse element.

BRIEF DESCRIPTION OF THE DRAWINGS

The above and other objects, features and advantages of the present invention will become more apparent from the following description taken in conjunction with the accompanying drawings, wherein.

DETAILED DESCRIPTION OF THE PREFERRED EMBODIMENTS

Figure 1:
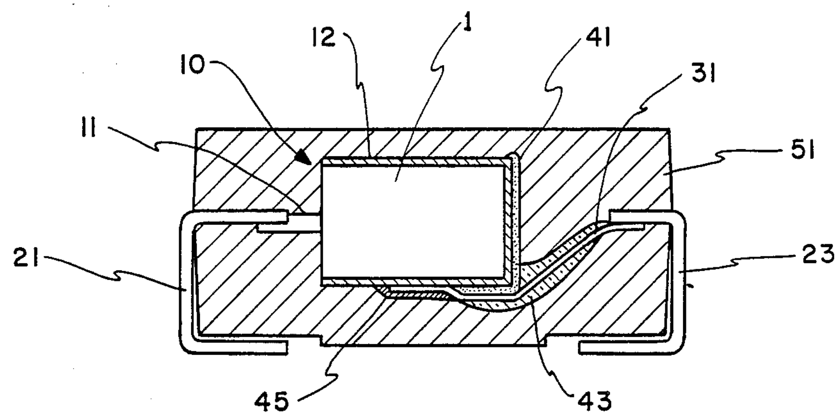
FIG. 1 is a sectional view of a first preferred embodiment of a fused chip type solid electrolytic capacitor according to the present invention.

Referring to FIG. 1, an anode terminal 11 is implanted in a surface of a columnar anode body 1 which is formed by sintering a valve metal powder, such as tantalum powder. The columnar anode body 1 is subjected to anodic oxidation to form an oxide film thereon. A manganese dioxide layer, a carbon layer and a silver paste layer are formed thereon sequentially. As a result, a solid electrolytic capacitor element 10 is formed with a cathode layer 12 in the outer-most layer.

One end of a rectangular-plate-shaped anode external lead 21 is welded to the anode termainal 11. One end of a rectangular-plate-shaped cathode external lead 23 is disposed in a position, which is spaced from the bottom surface of the solid electrolytic capacitor element 10, and is connected to one end of a fuse 31. The other end of the fuse 31 is connected to the cathode layer 12 on the side surface of the capacitor element 10 which is closer to the mounting surface of a chip type capacitor.

This is the side which will be mounted on a circuit board. A thin insulating layer 41, such as silicone resin, is formed on a part of the side surface of the capacitor element 10 and on the bottom surface thereof so that an intermediate portion of the fuse 31 does not make contact with the cathode layer 12. The circumferential surface of the fuse 31 is coated with an elastic resin 43.

The assembly is thereafter encapsulated with an electrically insulating material 51, such as epoxy resin, by means of transfer molding, dipping or the like. Then the other end of the anode external lead 21 and the other end of the cathode external lead 23 are bent in to the shape of a letter "U", with the aems of the "U" extending toward the joint portion of the fuse 31 and capacitor element 10.

A preferred example of a method for connecting the fuse wire 31 will be described with reference to FIG. 2. The insulating layer 41 on a part of the side surface and the bottom surface of the capacitor element 10 can be formed easily by immersing a corner portion alone of the capacitor element 10 in a melted insulating, resin such as silicone, with the capacitor element 10 inclined during immersion. One end of the fuse wire 31 is joined to one end of the cathode external lead plate 23 by welding or soldering. The other end of the fuse 31 is then bent toward the capacitor element 10 and connected to the cathode layer 12 on the side surface of the capacitor element 10 by means of a conductive bonding agent 45 or a high temperture solder. The fuse element may consist of a known thin wire, such as one which is obtained by coating an aluminum core with palladium or copper, or by forming a wire from a known solder composed of 93.5% of lead, 5% of tin and 1.5% of silver, or a known solder composed of 97.5% of lead and 2.5% of silver.

The elastic resin suitably used to coat the fuse is a silicone resin. A layer of a silicone resin is formed so as to cover the fuse as a whole or at least the portion thereof which is between the external cathode lead and the bottom section of the capacitor element 10. A silicone resin in which a plurality of bubbles are mixed is perferably used. This enables the fusing characteristics to be further improved. The construction of a fuse thus coated with an elastic resin is explained in detail in U.S. Pat. No. 4,720,772 issued on Jan. 19, 1988.

According to the foregoing embodiment, since the cathode external lead 23 is spaced apart from the bottom surface of the capacitor element 10, there is no possibility of a direct contact to the capacitor element 10. Thus, the yield of the production is improved. Moreover, the total thickness of the chip type capacitor can be minimized, because the conventional thick adhesive resin layer is omitted.

Figure 2:
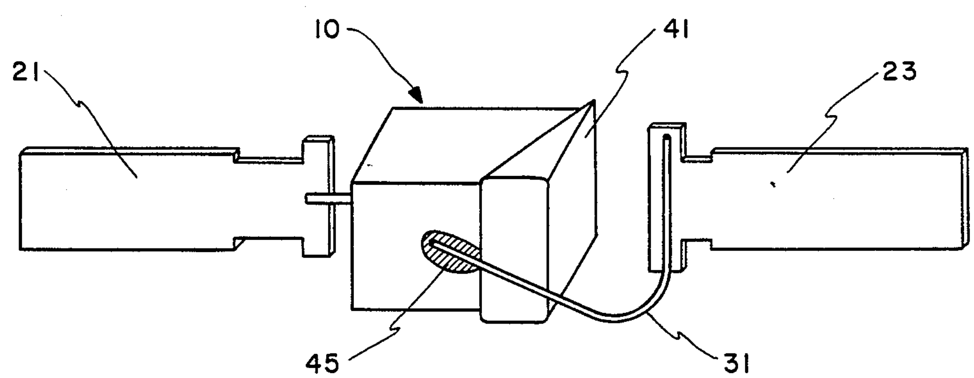
FIG. 2 is a perspective view for describing a fuse-fixing step in a process for manufacturing the chip type solid electrolytic capacitor shown in FIG. 1.

As is clear from FIGS.1 and 2, furthermore, the effective length of the fuse 31 may be made constant and made longer, i.e. it is not shorter than the sum of the distance between the cathode external lead 23 and the bottom surface of the capacitor element 10 and the width of the insulating layer 41 formed on the side surface of the capacitor element 10. Accordingly, this capacitor can, with certainty, be formed so that it has a fuse of an extremely long effective length as compared with a conventional capacitor in which a fuse is connected to the cathode external lead that is fixed on the side surface of the capacitor element 10.

When the effective length of the fuse is too short, it becomes mecessary for the diameter thereof to be reduced to increase the resistance value thereof for the purpose of permitting the fuse to be melted away by a fusing current of a predetermined level. However, if the diameter of the fuse is reduced, it is easily melted during a resin-coating operation, and the productivity yeild decreases. On the other hand, when the fuse structure according to the present invention is employed, the effective length of the fuse can be set extremely long. Then, it becomes unnecessary to reduce the diameter of the fuse, and the productivity yield can be improved. Moreover, since the effective length of the fuse can be set substantially constant, the fusing characteristics of the fuse can be made uniform. The quality of the product can be easily maintained.

An example of dimensions in the embodiment of FIG. 1 will now be given. The anode body of the capacitor element 10 has a corss-sectionally rectangular body, and a thickness of 1.7 mm, a width of 2.6 mm and a length of 2.5 mm with an anode wire of 1.8 mm in length projecting from the anode leading surface. The bottom surface of the capacitor element 10 and nearly a half of the side surface thereof which is on the side opposite the mounting surface are coated with a 0.1–0.2 mm thick insulating resin layer. The distance between the bottom surface of the capacitor element 10 and the external cathode lead 23 is about 0.8 mm. The effective length of the fuse wire 31 under such conditions is about 2.4 mm. When the assembly is encapsulated by the insulating resin, the obtained chip type capacitor has a length of 5.8 mm, a width of 3.2 mm and a thickness of 2.6 mm. The external anode and cathode leads derived from the resin layer are bent into the shape of the letter "U" and set to the length on the mounting surface of 1.3 mm.

In the embodiment of FIGS. 1 and 2, the insulating layer 41 is provided on the entire bottom surface of the capacitor element 10. Even when the insulating layer 41 is removed from the bottom surface, the effective length of the fuse 31 is little influenced. Accordingly, the insulating layer 41 may be limited to a part of the side surface of the capacitor element 10.

In the case where the effective length of the fuse may be sacrificed to a certain extent, the insulating layer 41 need not be formed at all.

An embodiment having no insulating layer will now be described with reference to FIG. 3. The members of this embodiment which are identical with those of the embodiment of FIG. 1 are designated by the same reference numerals and detailed descriptions thereof are omitted.

Figure 3:
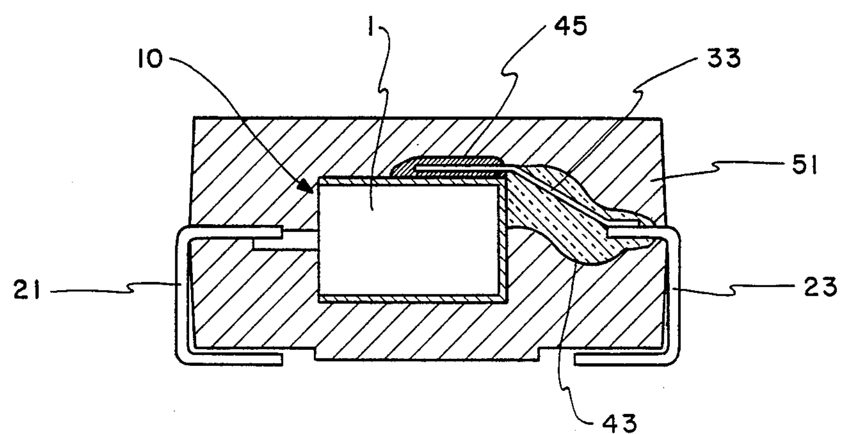
FIG. 3 is a sectional view of a second embodiment of the fused chip type solid electrolytic capacitor according to the present invention.

In the embodiment of FIG. 3, one end of a fuse wire 33 is connected to a cathode layer on a side surface of a capacity 10, which is remote from the mounting surface of the chip type capacitor. The other end of the fuse wire is connected to one end of an exteranl cathode lead 23. The effective length of the fuse 33 is slightly longer than the distance between the bottom surface of the capacitor element 10 and the cathode external lead 23, and is shorter than the fuse in the embodiment of FIG. 1 by a length corresponding to the width of the insulating layer 41.

As shown in FIG. 3, the joint portion of the fuse wire 33 and cathode external lead 23 are positioned on the outer side of the U-shaped lead 23. The joint portion of the fuse 33 and the cathode external lead 23 in the embodiment of FIG. 3 may be positioned on the inner side of the U-shaped cathode external lead 23. The joint portion of the fuse 33 and capacitor element 10 may be positioned on the lower surface of the capacitor element 10, i.e. closer to the mounting surface of the chip type capacitor in the same manner as in the embodiment of FIG. 1.

When a chip type solid electrolytic capacitor is mounted on a circuit board by reflow soldering, the heat is applied thereto from the upper surface thereof in most cases. In order to minimize the possibility that the fuse might be melted or detached from its joint portion while the capacitor is mounted, it is preferable for the fuse to be fixed to the portion closer to the mounting surface of the capacitor as shown in FIG. 1 rather than on the remote surface shown in FIG.3 of the capacitor.

In the above embodiments, the external anode and cathode leads are disposed on the same plane. In order to further increase the effective length of the fuse, it is also possible for the position of the end portion, which is connected to the fuse, of the cathode external lead shown in FIG. 1 to be shifted to a position which is closer to the mounting surface of the chip type capacitor.

What is claimed is:

1. A fused solid electorlytic capacitor comprising: a solid electorlytic capacitor element having a top surface with an anode terminal, a bottom surface opposite to said top surface, a side surface extending between said top surface and said bottom surface, and a cathode layer formed on said side surface and said bottom surface; an anode external lead having one end connected to said anode lead, the other end of said anode lead being bent in the shape of the letter "U" with the arms of said "U" extending toward said bottom surface; a thin insulating layer formed on the portions of said side surface and said bottom surface to partly cover said cathode layer; a cathode external lead having one end disposed in a position spaced from and opposite to said thin insulating layer formed on said bottom surface, the other end of said cathode external lead being bent in the shape of the letter "U" with arms of said "U" extending toward said top surface; a fuse element having one end connected to the inner surface of said one end of said cathode external lead, the other end of said fuse element being connected to the portion of said cathode layer formed on said side surface; an elastic resin coating the circumferential surface of said fuse element; and an insulating resin encapsulating said capacitor element and said elastic resin-coated fuse element.

2. A fused solid electrolytic capacitor comprising an electrolytic capacitor body having a spaced parallel pair of surfaces one of which is designed to confront a supporting structure, a fuse wire having one end connected to a first of said pair of surfaces, a cathode electrode connected to the other end of said fuse wire for coupling said capacitor to other circuit components, an anode electrode connected to a side of said body which extends perpendicularly with respect to said spaced parallel pair of surfaces, insulating material for enclosing said body while holding said cathode electrode a fixed distance away from said body so that said other end of said fuse wire is spaced apart from said body and positioned between the extending surfaces of said pair of surfaces thereby providing a fixed length for said fuse wire, and an elastic resin covering at least said fuse wire and separating it from said insulating material.

3. The capacitor of claim 2 and an elastic resin covering at least said fuse wire and separating it from said insulating material.

4. The capacitor of claim 2 and a layer of insulating material covering at least a portion of said body which confronts said fuse and said cathode electrode.

5. The capacitor of claim 2 wherein said one end of said fuse wire is connected said one of said spaced parallel surfaces which confronts said supporting structure.

6. The capacitor of claim 2 wherein said one end of said fuse wire is connected to the other of said spaced parallel pair of surfaces which does not confront said supporting structure.

7. A fused solid electrolytic capacitor comprising: a solid electrolytic capacitor element having a top surface provided with an anode terminal, a bottom surface opposite to said top surface, a side surface extending between said top and bottom surfaces, and a cathode layer formed on said side and bottom surfaces; an anode external lead disposed in a position spaced apart from and opposite to said bottom surface of said capacitor element; a fuse element having one end connected to said one end of said of cathode external lead, the other end of said fuse element being connected to said cathode layer on said side surface; a thin insulating layer formed partially on said cathode layer on said side surface to make the effective length of said fuse element long and constant; and an insulating material encapsulating said capacitor element and said fuse element.

* * * * *